United States Patent
Gamand et al.

(10) Patent No.: US 10,403,540 B2
(45) Date of Patent: Sep. 3, 2019

(54) INTEGRATED CIRCUIT

(71) Applicant: NXP B.V., Eindhoven (NL)

(72) Inventors: Patrice Gamand, Douvres la Delivrande (FR); Olivier Tesson, Bretteville l'Orgueilleuse (FR)

(73) Assignee: NXP B.V., Eindhoven (NL)

( * ) Notice: Subject to any disclaimer, the term of this patent is extended or adjusted under 35 U.S.C. 154(b) by 270 days.

(21) Appl. No.: 14/479,561

(22) Filed: Sep. 8, 2014

(65) Prior Publication Data
US 2015/0070240 A1 Mar. 12, 2015

(30) Foreign Application Priority Data

Sep. 11, 2013 (EP) ..................................... 13290215
Jan. 21, 2014 (EP) ..................................... 14152005

(51) Int. Cl.
*H01L 21/76* (2006.01)
*H01Q 1/48* (2006.01)
(Continued)

(52) U.S. Cl.
CPC ............ *H01L 21/76* (2013.01); *H01L 23/552* (2013.01); *H01L 23/645* (2013.01); *H01L 23/66* (2013.01);
(Continued)

(58) Field of Classification Search
CPC ..... H01L 21/76; H01L 23/552; H01L 23/645; H01L 23/66; H01L 27/13; H01Q 1/48; H01Q 1/521; H01Q 1/364
(Continued)

(56) References Cited

U.S. PATENT DOCUMENTS 6,639,299 B2 * 10/2003 Aoki ....................... H01L 21/56
257/528
2002/0134993 A1 * 9/2002 Leighton ................ H01L 23/64
257/177

(Continued)

FOREIGN PATENT DOCUMENTS

EP 1 251 558 A2 10/2002

OTHER PUBLICATIONS

Kerby ("Ground Plane Slot Structures for Isolation of Cosited Microstrip Antennas," Dissertation Submitted in partial fulfillment of the requirements for the degree of Doctor of Philosophy in Electrical and Computer Engineering in the Graduate College of the University of Illinois at Urbana-Champaign, 2009).*

(Continued)

*Primary Examiner* — Dieu Hien T Duong
*Assistant Examiner* — Bamidele A Jegede

(57) ABSTRACT

An integrated circuit for a packaged device is proposed. The circuit comprises: a circuit having first and second electromagnetic radiating elements fabricated on a die; a package substrate comprising an upper surface and a lower surface; and a grounding layer provided on the lower surface of the package substrate, the grounding layer being adapted to connect to a grounding plane of a printed circuit board. The die is mounted on the upper surface of the package substrate. The grounding layer comprises a void, at least a portion of the void being positioned so as to at least partially electromagnetically isolate the first electromagnetic radiating element from the second electromagnetic radiating element.

15 Claims, 7 Drawing Sheets

(51) Int. Cl.
*H01L 23/552* (2006.01)
*H01L 23/64* (2006.01)
*H01L 23/66* (2006.01)
*H01Q 1/52* (2006.01)
*H05K 1/02* (2006.01)
*H01L 23/00* (2006.01)

(52) U.S. Cl.
CPC ............... *H01Q 1/48* (2013.01); *H01Q 1/521* (2013.01); *H01L 24/16* (2013.01); *H01L 2223/6677* (2013.01); *H01L 2224/16227* (2013.01); *H01L 2924/15311* (2013.01); *H05K 1/0225* (2013.01)

(58) Field of Classification Search
USPC .......................................................... 343/848
See application file for complete search history.

(56) References Cited

U.S. PATENT DOCUMENTS

| | | | |
|---|---|---|---|
| 2003/0103006 A1 | 6/2003 | Yamada | |
| 2005/0099242 A1* | 5/2005 | Sano | H01P 5/107 333/26 |
| 2008/0159364 A1* | 7/2008 | Rofougaran | H01Q 1/2283 375/219 |
| 2008/0291107 A1* | 11/2008 | Tsai | H01Q 9/26 343/803 |
| 2009/0015353 A1* | 1/2009 | Rofougaran | G06K 7/10237 333/24 C |
| 2009/0117855 A1* | 5/2009 | Rofougaran | H01L 23/66 455/73 |
| 2009/0130990 A1* | 5/2009 | Rofougaran | H01L 23/66 455/73 |
| 2009/0322643 A1* | 12/2009 | Choudhury | H01Q 1/2291 343/851 |
| 2011/0038282 A1* | 2/2011 | Mihota | H04B 3/52 370/276 |
| 2012/0063094 A1* | 3/2012 | Gaynes | H05K 1/0206 361/707 |
| 2012/0086114 A1* | 4/2012 | Zhao | H01L 23/48 257/692 |
| 2012/0286049 A1* | 11/2012 | McCormack | H04B 1/40 235/492 |
| 2012/0295539 A1* | 11/2012 | McCormack | H04B 5/0031 455/39 |
| 2013/0099006 A1* | 4/2013 | Hong | H01Q 1/2283 235/492 |

OTHER PUBLICATIONS

Ulrich, Richard K., et al; Advanced Electronic Packaging—2$^{nd}$ Edition; IEEE Press Series on Microelectronic Systems, Chapter 2—Radio Frequency and Microwave Packaging; Wiley Interscience; p. 514 (2006).

Extended European Search Report for application No. 14152005.6 (dated Mar. 12, 2015).

* cited by examiner

INTEGRATED CIRCUIT

CROSS-REFERENCE TO RELATED APPLICATIONS

This application claims the priority under 35 U.S.C. § 119 of European patent application no. 14152005.6, filed on Jan. 21, 2014 and 13290215.6 filed on Sep. 11, 2013, the contents of which are incorporated by reference herein.

This invention relates to an integrated circuit, and more particularly to an integrated circuit for packaged device.

The evolution of radio-communication systems has led to implementations of receiver and/or transmitter chains in integrated circuit form. Well-known examples are used in portable mobile radio frequency (RF) transceiver circuits, satellite communication microwave receivers, WLAN RF circuits etc.

A schematic block diagram of a typical dual polarization receiver chain in its most elementary form is shown in FIG. 1.

A first antenna 10a is for horizontally polarized radiation, and a second antenna 10b is for vertically polarized radiation. Each antenna includes a electromagnetic radiating element shown as 10a' and 10b', respectively. Each antenna chain has an amplifier 12a, 12b and a filter 14a, 14b. Each chain has a LC resonator-based local oscillator 16a, 16b which provides a signal to a mixer 18a,18b which perform a down-conversion function. Each of the local oscillators also includes an electromagnetic radiating element 16a and 16b', respectively.

Details of its operation are well known in the field of RF transmitter and receiver circuits. Consequently, detailed explanation of the receiver chain of FIG. 1 will be omitted.

As the two receiver chains are required to operate at the same time, interference and electromagnetic coupling between these two receiver chains should be minimised in order to avoid unwanted inter-modulation signals and achieve optimal operation.

When provided in integrated circuit form, the circuit contains the oscillators with integrated inductors. Since the inductors and coils are electromagnetic radiating elements, there may be electromagnetic coupling and interference between them. By way of example, the arrows 20 in FIG. 1 represent interference paths.

In order to reduce the coupling between the two receiver chains of an integrated circuit, it is known to employ:
 a large distance on the silicon die to reduce the coupling with the oscillators;
 two separate circuits; and
 flip chip architecture for high frequency applications, as this allows a reduction in electromagnetic coupling by avoiding wire bonds;

However, the known approaches generally lead to an increase in the circuit area of the integrated circuit and thus requires a larger package.

Also, as frequency of operation is increased, the isolation is degraded. As a result, the isolation requirements for some high frequency applications, such as satellite communications, cannot easily be met by the known measures. For example, for satellite communications, isolation between the two receiver chains for two polarizations should be at least 60 dB at 12 GHz. However, the typical isolation performance in conventional packaged circuits is around 45 dB at 12 GHz.

The invention is defined by the claims.

There is provided an integrated circuit for a packaged device, the circuit comprising: a circuit having first and second electromagnetic radiating elements fabricated on a die; a package substrate comprising an upper surface and a lower surface; and a grounding layer provided on the lower surface of the package substrate, the grounding layer being adapted to connect to a grounding plane of a printed circuit board (PCB), wherein the die is mounted on the upper surface of the package substrate, and wherein the grounding layer comprises a void, at least a portion of the void being positioned so as to at least partially electromagnetically isolate the first electromagnetic radiating element from the second electromagnetic radiating element.

At least a portion of the void may be positioned directly below an area extending between the first and second electromagnetic radiating elements. Embodiments may therefore improve electromagnetic isolation between electromagnetic radiating elements by removing a portion of the ground plane positioned underneath and between the electromagnetic radiating elements so that magnetic field generated by one of the radiating elements may be somewhat constrained to the vicinity of the electromagnetic radiating element, thereby reducing electromagnetic coupling to the other radiating element. Embodiments may thus reduce the electromagnetic coupling between two adjacent or neighbouring electromagnetic radiating elements fabricated on a die by having a void formed in the grounding plane of a substrate supporting the die. When viewed from above, the void may be positioned underneath a (footprint) area containing both of the electromagnetic radiating elements.

Embodiments employ the principle of improving isolation between electromagnetic radiating elements by cutting a ground plane across an electromagnetic field path between the electromagnetic radiating elements in an attempt to electromagnetically isolate the electromagnetic radiating elements from each other. In other words, when viewed from above, the void formed in the ground plane may extend across an imaginary path drawn between the electromagnetic radiating elements.

Here, the package substrate may be a high resistivity substrate. For the purpose of improved understanding, high resistivity is considered as around 50 $\Omega$*cm or above, preferably 100 $\Omega$*cm or above, and even more preferably 1 K$\Omega$*cm or above. Conversely, low resistivity is considered to be around or below 10 $\Omega$*cm, preferably below 1 $\Omega$*cm, and even more preferably below 1 m$\Omega$*cm. Thus, embodiments may employ a high resistivity package substrate having a resistivity that is several orders of magnitude greater than the resistivity of a conventional low resistivity substrate.

The void may comprise a segment of the grounding layer that has been removed, the segment extending from an edge of the grounding layer. In other words, a void may be formed by removing a portion of an edge of the grounding layer. This enables simple formation of the void. By way of example, a void may be formed by etching or drilling the grounding layer.

The horizontal extent of the void in a first direction may be greater than that of the area between the first and second electromagnetic radiating elements. This may help to ensure that the electromagnetic field of one electromagnetic radiating is isolated from the other electromagnetic radiating.

The circuit may comprise a receiver comprising a RF chain having an antenna and a local oscillator, wherein the antenna comprises the first electromagnetic radiating element and the local oscillator comprises the second electromagnetic radiating element. Thus, embodiments may provide a receiver circuit having reduced electromagnetic coupling between electromagnetic radiating elements.

Existing circuits may be modified according to an embodiment of the invention so as to reduce electromagnetic coupling between adjacent or neighbouring electromagnetic radiating elements fabricated on a die.

According to another aspect of the invention, there is provided a method of manufacturing an integrated circuit comprising the steps of: providing a circuit having first and second electromagnetic radiating elements fabricated on a die; providing a package substrate comprising an upper surface and a lower surface, a grounding layer being provided on the lower surface of the package substrate and comprising a void, wherein the grounding layer is adapted to connect to a grounding plane of a PCB; and mounting the die on the upper surface of the package substrate such that at least a portion of the void is positioned so as to at least partially electromagnetically isolate the first electromagnetic radiating element from the second electromagnetic radiating element.

By way of example, embodiments may be employed in a satellite communication receiver or a RF transceiver. Embodiments may be packaged to provide discrete devices. Embodiments may be used in combination with other measures to further reduce electromagnetic coupling and/or interference and achieve required specifications.

The above and other advantages will be apparent from the exemplary description of the accompanying drawings in which FIG. 1 is a schematic block diagram of a typical dual polarization receiver chain in its most elementary form;

It is proposed to include a void in the grounding layer of a circuit so as to improve isolation between electromagnetic radiating elements.

Figure 1:
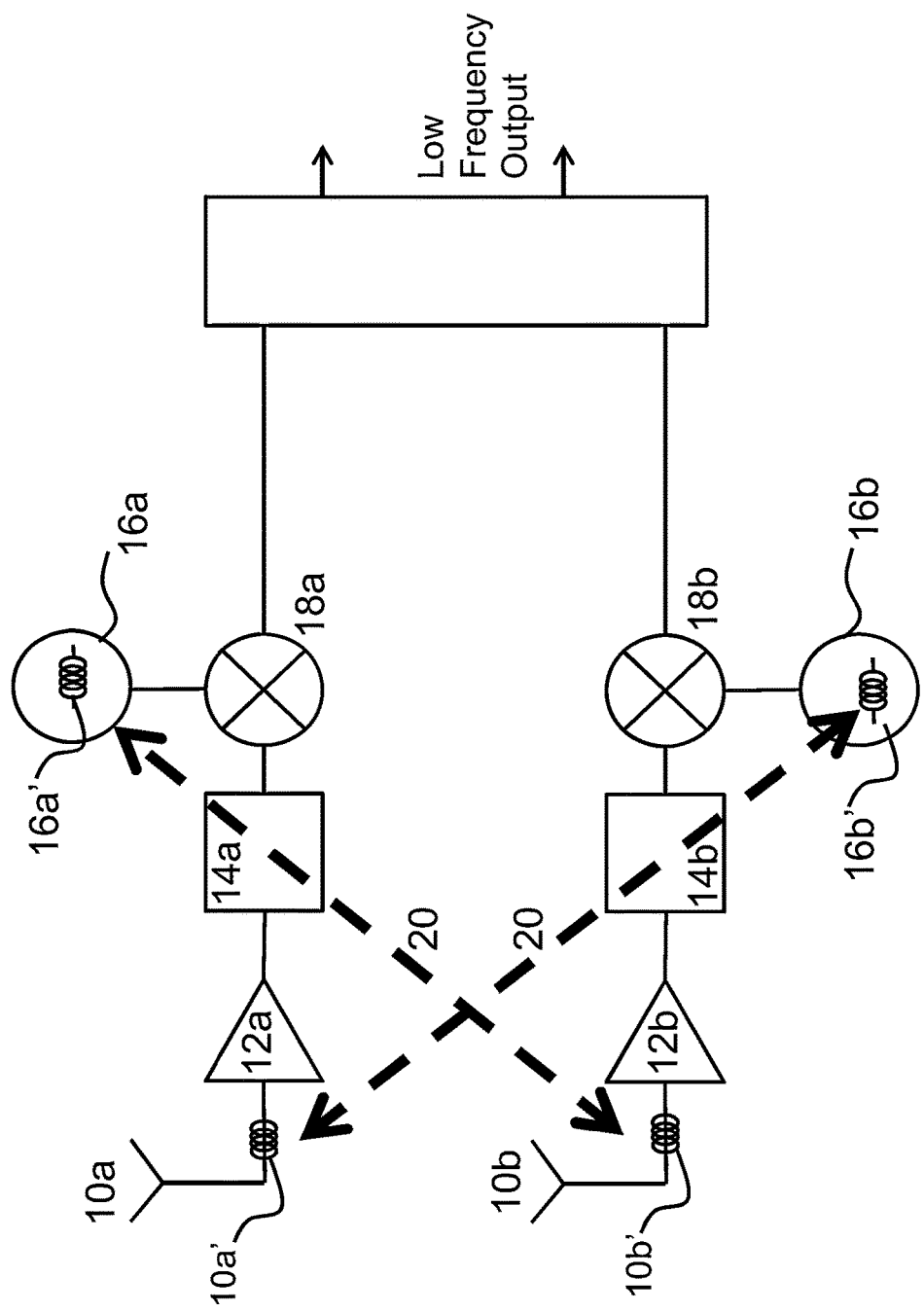
Figure 2:
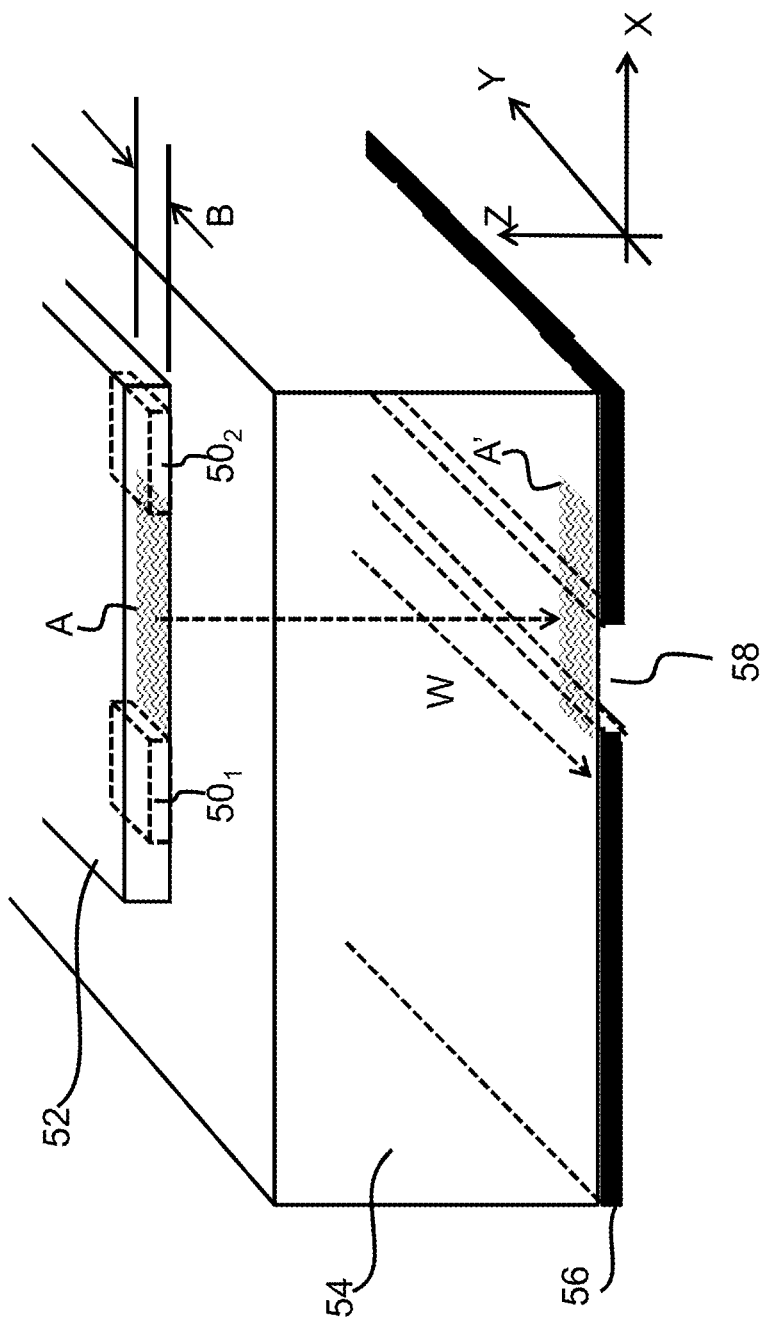
FIG. 2 illustrates an integrated circuit according to an embodiment.

FIG. 2 illustrates an integrated circuit according to an embodiment. The integrated circuit comprise a first $50_1$ and second $50_2$ electromagnetic radiating elements fabricated on a die 52. The die 52 is mounted on the upper surface of a package substrate 54, and the lower surface of the package substrate 54 has a grounding layer 56 provided thereon. Here, the package substrate 54 is an electrically insulating substrate formed from high resistivity silicon or GaAs or an insulating substrate formed from a laminate, PTFE, epoxy, etc.

The grounding layer 56 is adapted to connect to a grounding plane of a PCB.

The grounding layer 56 comprises a void 58 that is shaped and positioned such that the void 58 is situated directly underneath the area A linearly connecting the first $50_1$ and second $50_2$ electromagnetic radiating elements. For a better understanding, the area A connecting the first $50_1$ and second $50_2$ electromagnetic radiating elements is indicated by a chevron-filled area labelled "A" in FIG. 2. When this area A connecting the first $50_1$ and second $50_2$ electromagnetic radiating elements is projected vertically downwards to the grounding layer 56 its horizontal position relative to the grounding layer 56 can be visualised as the area labelled A'. Thus, when viewed from vertically above, the void 58 is positioned underneath the area A linearly connecting the electromagnetic radiating elements $50_1$ and $50_2$.

Put another way, the void 58 is positioned vertically below the area A filling the horizontal space between the first $50_1$ and second $50_2$ electromagnetic radiating elements. Thus, vertically below (when viewed from above) the gap between the first $50_1$ and second $50_2$ electromagnetic radiating elements there is provided a hole, aperture or gap 58 in the grounding layer 56. Here, the horizontal extent of void 58 in the y-axis (i.e. the direction in the page of FIG. 2), as indicated by the arrow labelled "W", is greater than the horizontal extent of the area A in the y-axis, as indicated by the arrow labelled "B". Thus, when expressed as an equation, W>B.

Accordingly, it will be understood that a void 58 may comprise a segment of the grounding layer 56 that has been removed. In other words, a void may be formed by removing a portion the grounding layer 56. This enables simple formation of the void (by chemical etching or mechanical drilling, for example).

The embodiment of FIG. 2 employs a principle of improving isolation between the first 50 and second $50_2$ electromagnetic radiating elements by cutting the grounding layer 56 across an electromagnetic field path (represented in a simplified fashion by area A) between the first $50_1$ and second electromagnetic radiating elements in an attempt to electromagnetically isolate them from each other. In other words, when viewed from above, the void 58 formed in the grounding layer 56 extends across an imaginary path (such as area A) drawn between the first $50_1$ and second 507 electromagnetic radiating elements.

Figure 3:
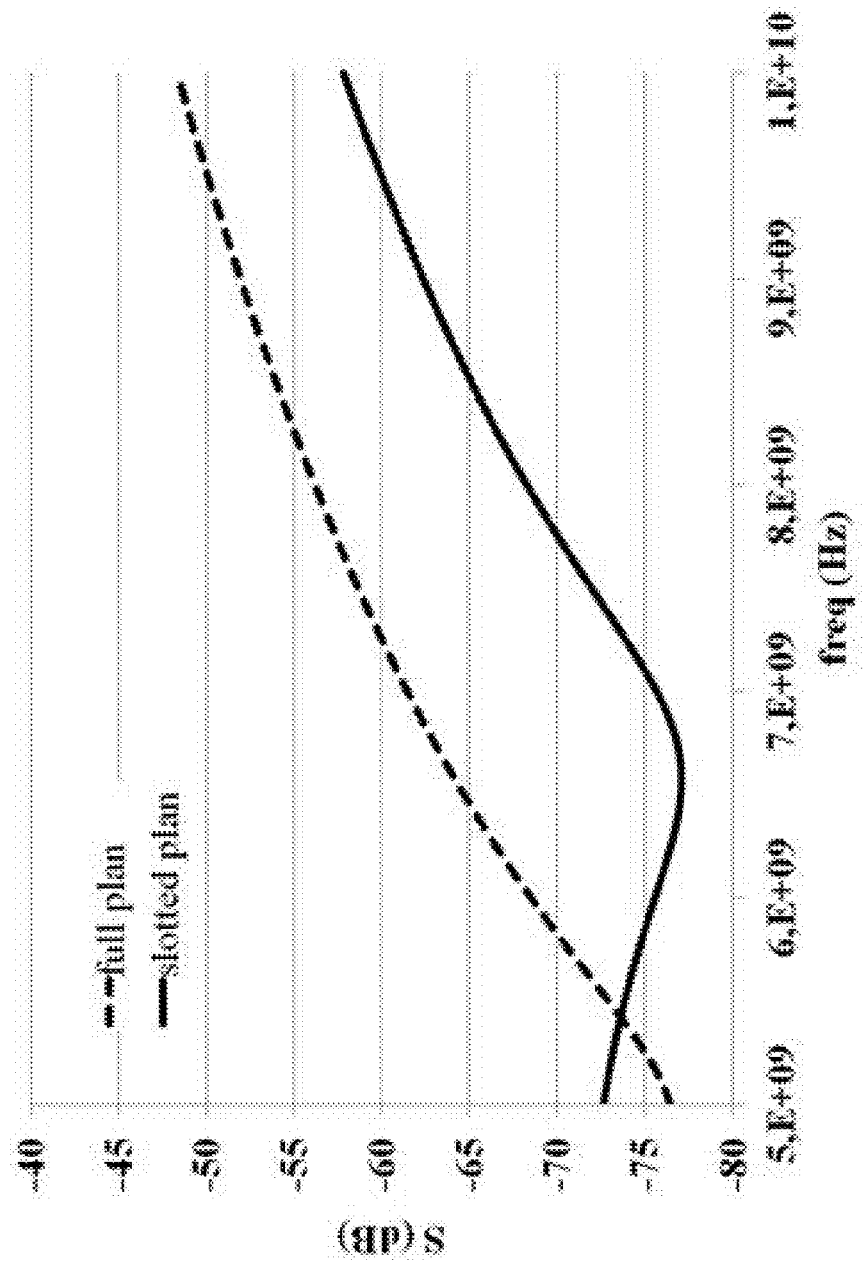
FIG. 3 is a graph illustrating the improvement achieved at microwave frequencies by an embodiment.

Such isolation is illustrated by FIG. 3 which shows the variation of isolation versus operating frequency for a conventional circuit (indicated by the dashed line) and for a circuit comprising a ground plane with a void according to an embodiment (indicated by the solid line). From the graph of FIG. 3 it can be seen the isolation between radiating elements is improved at microwave frequencies for the circuit according to an embodiment of the invention.

Experiments may be undertaken using such simulations to optimize the position(s) of a void formed in the grounding layer to minimize electromagnetic coupling between the electromagnetic radiating elements.

Figure 4:
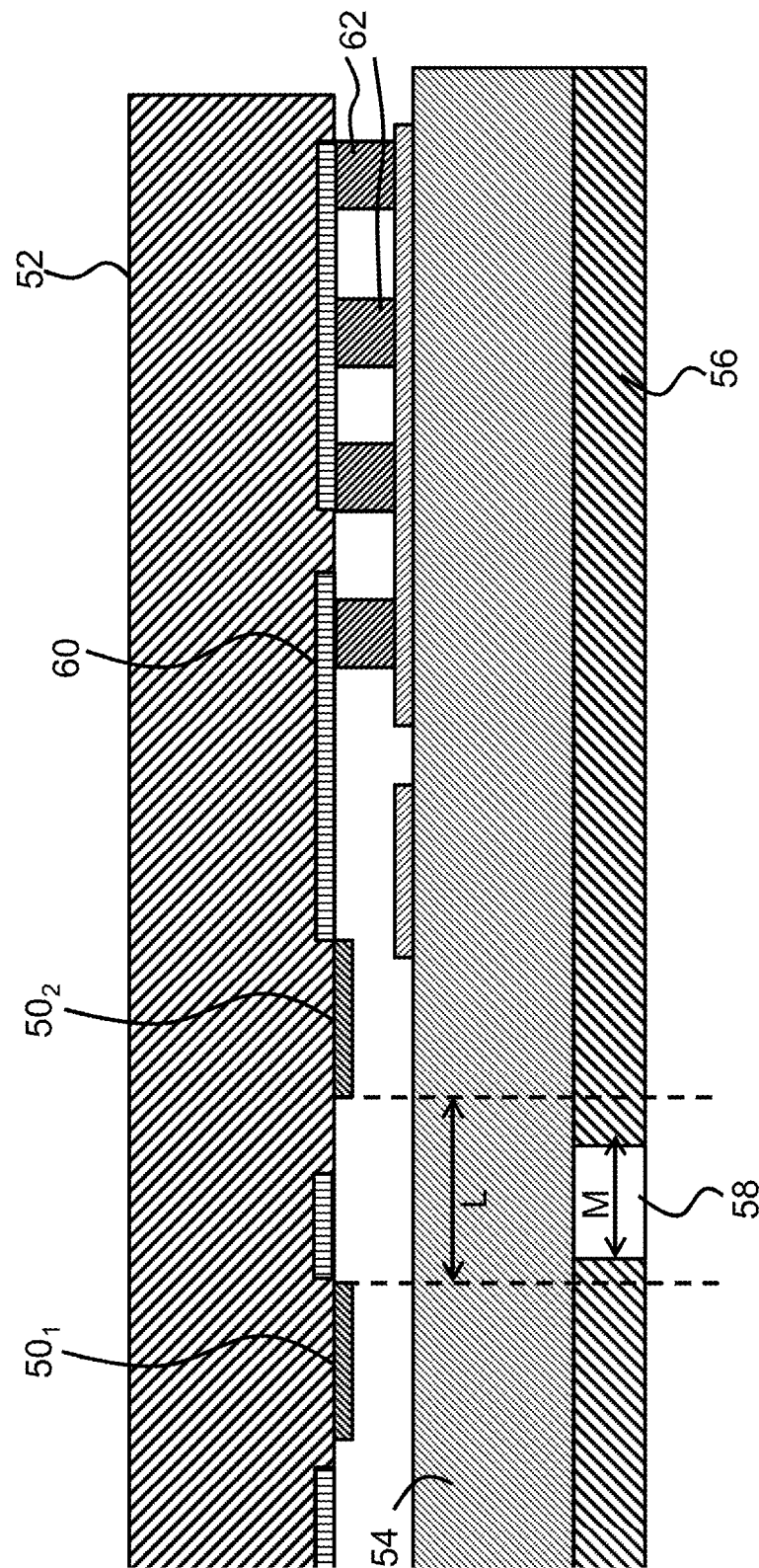
FIG. 4 is a cross sectional view of an embodiment.

Turning now to FIG. 4, there is shown a cross-sectional view of a flip-chip assembly configuration according to an embodiment.

First $50_1$ and second $50_2$ electromagnetic radiating elements fabricated on a silicon die 52 (along with other circuit elements 60). The die 52 is flip-chip bumped to the upper surface of a package substrate 54 via connecting bumps 62. The lower surface of the package substrate 54 has a grounding layer 56 provided thereon. The grounding layer 56 is adapted to connect to a grounding plane of a PCB.

The grounding layer 56 comprises a void 58 that is situated directly underneath the horizontal area (indicated by the arrow labelled "L") extending between the first $50_1$ and second $50_2$ electromagnetic radiating elements. Here, the horizontal width W of the void 58 is less than the horizontal width L of the area extending between the first $50_1$ and second $50_2$ electromagnetic radiating elements. Accordingly, the entire width M of the void 58 situated vertically below the area extending between the first $50_1$ and second $50_2$ electromagnetic radiating elements. By way of example, the horizontal width W of the void 58 in this embodiment is 50 µm.

Figure 5:
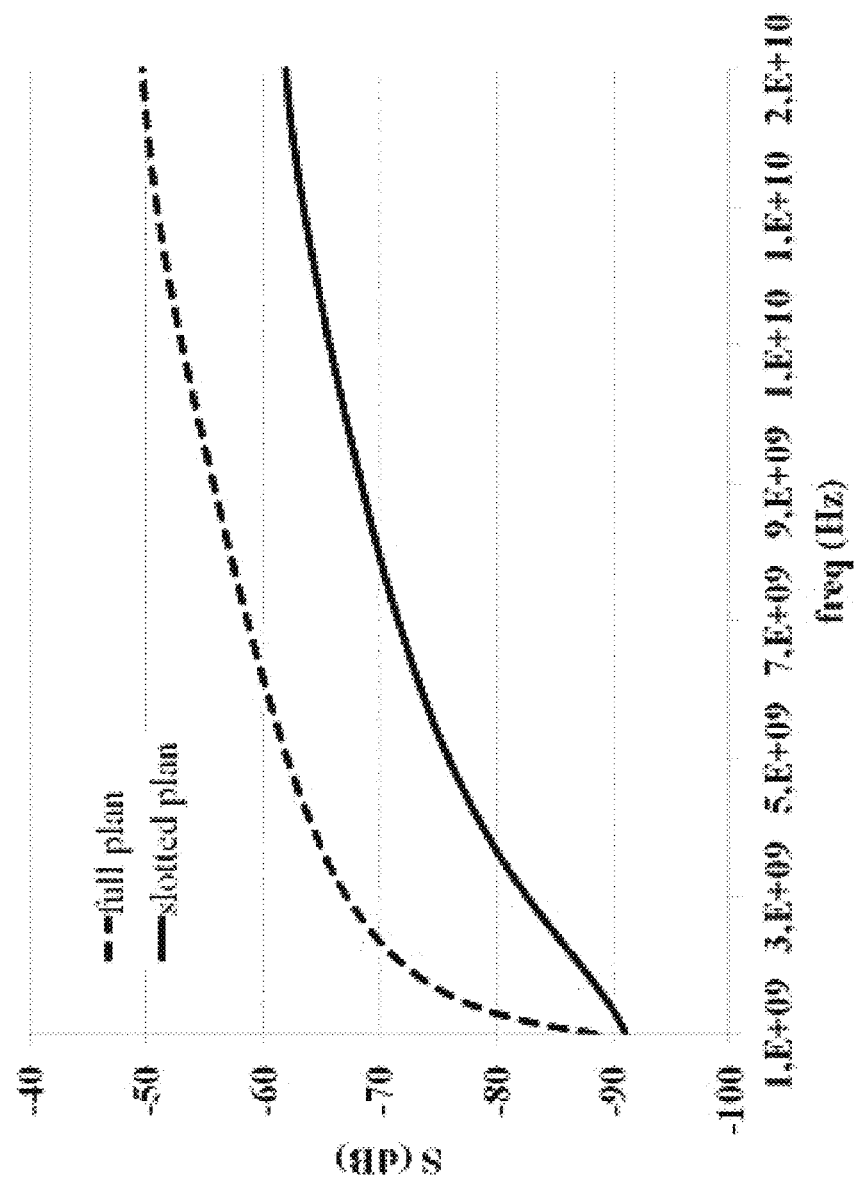
FIG. 5 is a graph illustrating the improvement in electromagnetic isolation achieved by an embodiment.

FIG. 5 shows the simulated variation of isolation versus operating frequency for a conventional high-frequency packaged circuit (indicated by the dashed line) and for a high-frequency packaged circuit comprising the embodiment of FIG. 4 (indicated by the solid line). From the graph of FIG. 5 it can be seen that the embodiment provides a 10 dB improvement in isolation when compared to the conventional circuit. Accordingly, embodiments of the invention may help to meet system specifications for a dual polarization receiver operating in microwave frequency bands.

Figure 6:
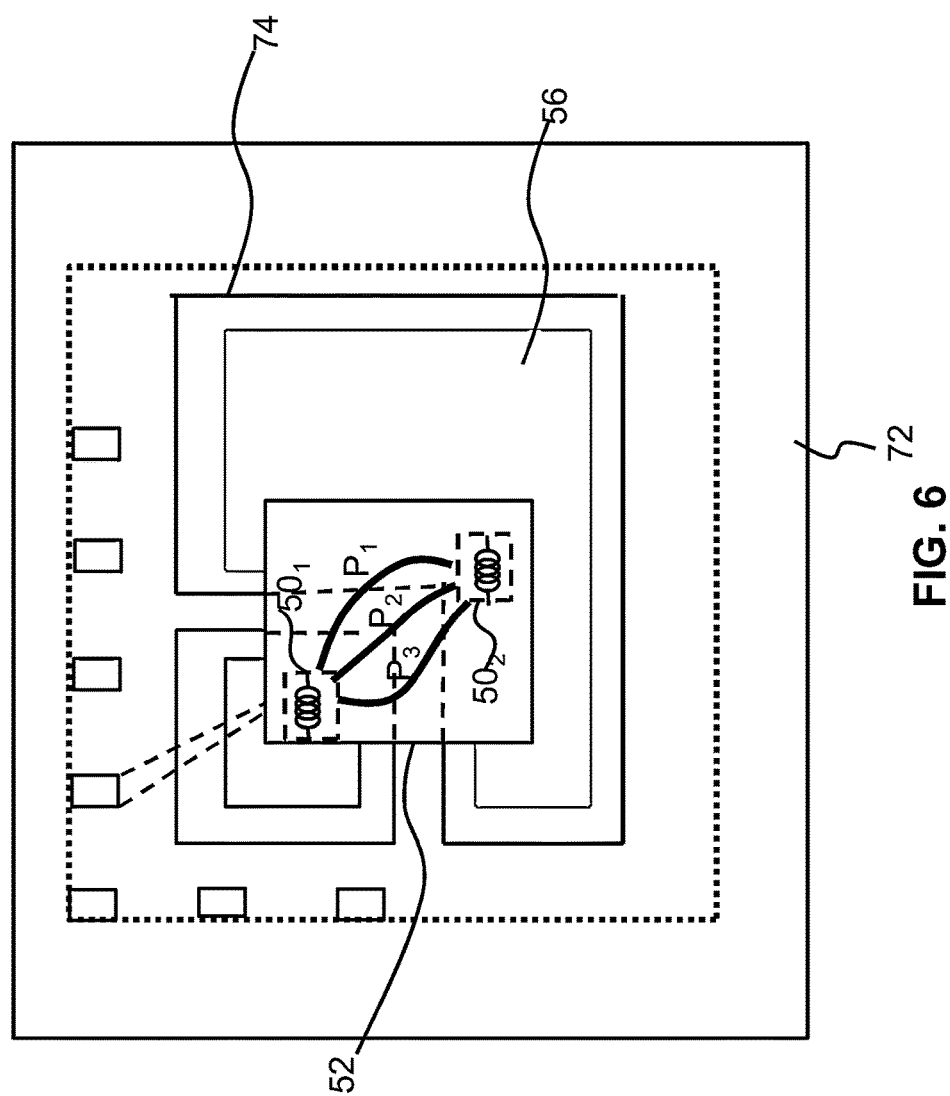
FIG. 6 is a plan view of an embodiment.
Figure 7:
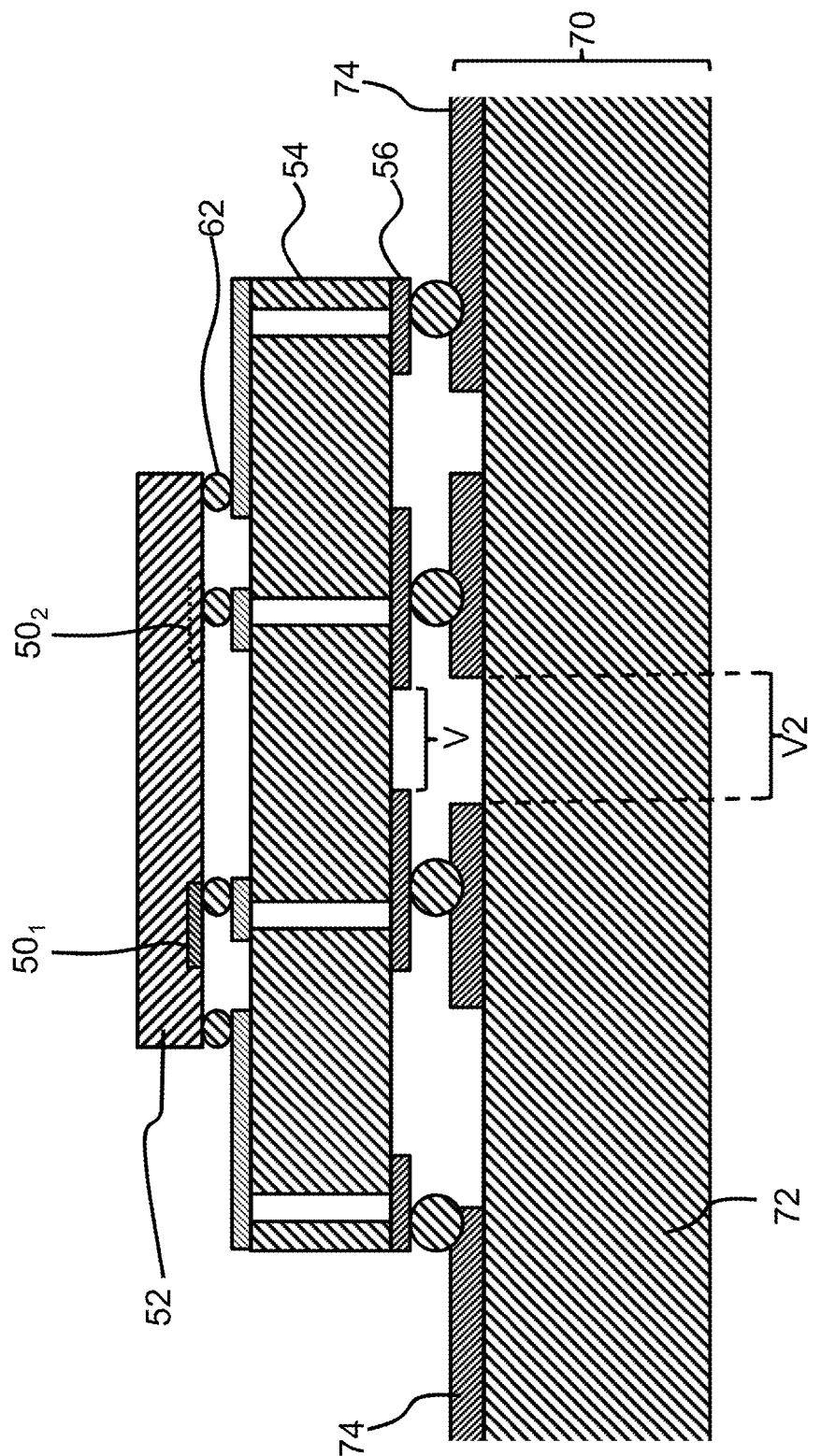
FIG. 7 is a cross sectional view of another embodiment of the invention.

Referring now to FIGS. 6 and 7 there is shown an embodiment comprising a PCB which may be used in within a package. Here, a circuit is fabricated on a die which is flip-chip bonded to a package substrate, wherein the package substrate (and thus also the die) is mounted on a PCB.

In more detail, first $50_1$ and second $50_2$ electromagnetic radiating elements are fabricated on a silicon die 52. The die 52 is flip-chip bonded to the upper surface of a package substrate 54 via connecting bumps 62. The lower surface of the package substrate 54 has a grounding layer 56 provided thereon.

The grounding layer 56 comprises a void V that is situated directly underneath the area extending between the first $50_1$ and second electromagnetic radiating elements. When viewed from above, as in FIG. 6, the void V extends across an imaginary path Pn drawn between the first $50_1$ and second $50_2$ electromagnetic radiating elements.

The package substrate 54 is mounted on the PCB so that the grounding layer is connected to a grounding plane 74 provided on the upper surface of the PCB substrate 72. Here, the grounding plane 74 of the PCB 70 also comprises a void V2 which is positioned directly underneath the void V of the grounding layer 56.

An approach to implementing an embodiment may be summarised in the following steps:

Identify on the circuit(s) the electromagnetic radiating elements which may be electromagnetically coupled to each other and influence performance;

employ a flip-chip bumping technique to eliminate bonding wire connexions between circuit pads and package leads. The flip-chip bumping technique may also remove the constraint of the low resistivity of the substrate in case of an integrated circuit on a semiconductor substrate because, in that case, there is no ground plane directly attached on the semiconductor substrate and therefore there is no degradation of the coupling between the radiating elements; and create, in the ground plane, a void to separate the ground plane of each radiating element. Here, the ground plane may be formed from one of the metal layers of the package substrate.

It may be possible to employ more than one void if there are more than two electromagnetic radiating elements.

The ground plane may therefore be patterned and this can be used to build other passive functions like an in-package antenna reflector, filters, microwave passive circuits, etc. Accordingly, it will be appreciated that embodiments can be used in satellite communication systems or microwave integrated solutions.

Embodiments may be used to address isolation requirements in microwave applications, and more particularly satellite communication applications. The proposed concept of using a void in the grounding plane so to split the grounding plan between electromagnetic elements may therefore be particularly useful where several receivers need to co-exist in a single die and the isolation requirement between them can be as high as 60 dB in the Ku band (12 to 18 GHz).

Various modifications will be apparent to those skilled in the art. For example, although the above described embodiments comprise a single die, other embodiment may comprise more than one die. Furthermore, although the above described embodiment comprises a single aperture or void vertically below area including both radiating elements, alternative embodiments may employ other arrangements of apertures or void in the grounding plane. By way of example, the embodiment of FIGS. 6 and 7 may be modified so as to comprise first and second voids in the grounding plane, both voids being substantially parallel and crossing across any imaginary path Pn drawn between the first and second electromagnetic radiating elements.

The invention claimed is:

1. An integrated circuit for a packaged device, the circuit comprising:
    a circuit having first and second electromagnetic radiating elements fabricated on a die, wherein the first and second electromagnetic radiating elements are on different signal paths;
    a package substrate comprising an upper surface and a lower surface; and
    a grounding layer provided directly on the lower surface of the package substrate, the grounding layer being adapted to connect to a grounding plane of a printed circuit board, PCB,
    wherein the die is mounted on the upper surface of the package substrate,
    wherein the grounding layer comprises a void positioned so as to electromagnetically isolate the first electromagnetic radiating element from the second electromagnetic radiating element, and
    wherein at least a portion of the void is positioned directly below an area extending between the first and second electromagnetic radiating elements.

2. The circuit of claim 1,
    wherein the void comprises a segment of the grounding layer that has been removed, the segment extending from an edge of the grounding layer.

3. The circuit of claim 1,
    wherein the package substrate is a high resistivity substrate.

4. The circuit of claim 1, wherein a horizontal extent of the void in a first direction is greater than that of the area extending between the first and second electromagnetic radiating elements.

5. The circuit of claim 1,
    wherein, when viewed from above, the void extends across an imaginary path drawn between the first and second electromagnetic radiating elements.

6. The circuit of claim 1,
    wherein the circuit comprises a receiver comprising a radio frequency chain having an antenna and a local oscillator, and
    wherein the antenna comprises the first electromagnetic radiating element and the local oscillator comprises the second electromagnetic radiating element.

7. The circuit of claim 1,
    wherein the die is flip-chip bumped to the upper surface of the package substrate.

8. The circuit of claim 1,
    further comprising a PCB having a grounding plane provided thereon,
    wherein the package substrate is mounted on the PCB so that the grounding layer is connected to the grounding plane of the PCB.

9. The circuit of claim 8,
wherein the grounding plane of the PCB comprises a void, and
wherein at least a portion of the void of the grounding plane is positioned directly below the void of the grounding layer.

10. A satellite communication circuit
comprising an integrated circuit according to claim 1.

11. A radio frequency circuit
comprising an integrated circuit according to claim 1.

12. A packaged device
comprising an integrated circuit according to claim 1.

13. The circuit of claim 1, wherein the first and second electromagnetic radiating elements are fabricated on a same die.

14. A method of manufacturing an integrated circuit comprising:
providing a circuit having first and second electromagnetic radiating elements fabricated on a die, wherein the first and second electromagnetic radiating elements are on different signal paths;
providing a package substrate including an upper surface and a lower surface, a grounding layer being provided directly on the lower surface of the package substrate and including a void, wherein the grounding layer is adapted to connect to a grounding plane of a PCB; and
mounting the die on the upper surface of the package substrate such that the void is positioned so as to electromagnetically isolate the first electromagnetic radiating element from the second electromagnetic radiating element,
wherein at least a portion of the void is positioned directly below an area extending between the first and second electromagnetic radiating elements.

15. The method of claim 13,
further comprising the step of mounting the package substrate on a PCB having a grounding plane so that the grounding layer is connected to the grounding plane of the PCB,
wherein the grounding plane of the PCB comprises a void, and
wherein at least a portion of the void of the grounding plane is positioned directly below the void of the grounding layer.

* * * * *